(12) United States Patent
Huang

(10) Patent No.: US 12,727,148 B2
(45) Date of Patent: Sep. 1, 2026

(54) SEMICONDUCTOR STRUCTURE AND MANUFACTURING METHOD THEREFOR

(71) Applicant: CHANGXIN MEMORY TECHNOLOGIES, INC., Hefei City (CN)

(72) Inventor: Meng Huang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 643 days.

(21) Appl. No.: 18/193,170

(22) Filed: Mar. 30, 2023

(65) Prior Publication Data

US 2024/0032282 A1 Jan. 25, 2024

Related U.S. Application Data

(63) Continuation of application No. PCT/CN2022/110611, filed on Aug. 5, 2022.

(30) Foreign Application Priority Data

Jul. 22, 2022 (CN) ......................... 202210869242.9

(51) Int. Cl.
*H10B 12/00* (2023.01)

(52) U.S. Cl.
CPC ............. *H10B 12/48* (2023.02); *H10B 12/03* (2023.02)

(58) Field of Classification Search
CPC ........ H10B 12/03; H10B 12/05; H10B 12/48; H10D 1/714
See application file for complete search history.

(56) References Cited

U.S. PATENT DOCUMENTS 7,563,688 B2 7/2009 Sun
11,043,498 B1 6/2021 Han
(Continued)

FOREIGN PATENT DOCUMENTS

CN 112151546 A 12/2020
CN 112331663 A 2/2021
(Continued)

OTHER PUBLICATIONS

International Search Report in the international application No. PCT/CN2022/110611, mailed on Mar. 20, 2023.

*Primary Examiner* — Sue A Purvis
*Assistant Examiner* — Kevin Quinto
(74) *Attorney, Agent, or Firm* — Syncoda LLC; Feng Ma

(57) ABSTRACT

A semiconductor structure includes: a substrate; a stacked structure, contact structures, and storage nodes. The stacked structure is located on the substrate and includes semiconductor layers extending in a first direction and arranged in a spaced manner in a second direction and in a third direction, wherein the first direction and the second direction are directions parallel to a plane where the substrate is located, the first direction is perpendicular to the second direction, and the third direction is a direction perpendicular to the plane where the substrate is located. The contact structures include a first end and a second end in the first direction, wherein the first ends of the contact structures are connected to the semiconductor layers, and a material of the contact structures includes metal silicide. The storage nodes extend in the first direction and are connected to a second end of respective contact structures.

14 Claims, 11 Drawing Sheets

(56) References Cited

U.S. PATENT DOCUMENTS

| | | | | |
|---|---|---|---|---|
| 11,417,659 | B2 | 8/2022 | Son | |
| 2007/0202657 | A1 | 8/2007 | Sun | |
| 2021/0104526 | A1 | 4/2021 | Son | |
| 2021/0210492 | A1 | 7/2021 | Han et al. | |
| 2021/0391331 | A1* | 12/2021 | Lin | H10D 1/714 |
| 2022/0085023 | A1* | 3/2022 | Shin | H10B 12/03 |

FOREIGN PATENT DOCUMENTS

| | | | |
|---|---|---|---|
| CN | 112635471 | A | 4/2021 |
| CN | 113161355 | A | 7/2021 |
| CN | 114171520 | A | 3/2022 |
| KR | 20070088243 | A | 8/2007 |

* cited by examiner

SEMICONDUCTOR STRUCTURE AND MANUFACTURING METHOD THEREFOR

CROSS-REFERENCE TO RELATED APPLICATIONS

This application is a continuation of International Patent Application No. PCT/CN2022/110611 filed on Aug. 5, 2022, which claims priority to Chinese Patent Application No. 202210869242.9 filed on Jul. 22, 2022. The disclosure of these applications is hereby incorporated by reference in their entireties.

BACKGROUND

With the continuous development of a semiconductor technology, as a novel semiconductor memory device, Dynamic Random Access Memory (DRAM) is increasingly applied in the manufacture and use of device such as computers. The DRAM is composed of a plurality of repeated storage units, and each storage unit generally includes a capacitor and a transistor.

In a semiconductor manufacturing process, with the reduction of key sizes, a resistance problem is urgently to be solved.

SUMMARY

The disclosure relates to the technical field of semiconductor manufacturing, Embodiments of the present disclosure provide a semiconductor structure and a manufacturing method therefor.

A first aspect of the embodiments of the present disclosure provides a semiconductor structure. The semiconductor structure includes a substrate, a stacked structure, contact structures and storage nodes.

The stacked structure is located on the substrate and includes semiconductor layers that extend in a first direction and are arranged in a spaced manner in a second direction and in a third direction. The first direction and the second direction are directions parallel to a plane where the substrate is located. The first direction is perpendicular to the second direction. The third direction is a direction perpendicular to the plane where the substrate is located.

Each contact structure includes a first end and a second end in the first direction. The first end of the contact structure is connected to a respective one of the semiconductor layers. A material of the contact structures includes metal silicide.

The storage nodes extend in the first direction and each storage node is connected to the second end of a respective one of the contact structures.

A second aspect of an embodiment of the present disclosure provides a method for manufacturing a semiconductor structure. The method includes the following operations.

A substrate is provided.

A stacked structure pre-layer is formed on the substrate. The stacked structure pre-layer includes first semiconductor material layers and second semiconductor material layers that are alternately stacked in a third direction. The third direction is a direction perpendicular to a plane where the substrate is located.

The stacked structure pre-layer is etched to form a plurality of trenches penetrating the stacked structure pre-layer. The trenches extend in a first direction; and vertical insulation layers are formed in the trenches. The first direction is a direction parallel to the plane where the substrate is located.

Part of the second semiconductor material layers and part of the vertical insulation layers are removed to form an opening extending in a second direction. Part of the first semiconductor material layers is exposed from the opening. The second direction is parallel to the plane where the substrate is located and perpendicular to the first direction.

A silicification reaction is performed on the first semiconductor material layers exposed from the opening to form contact structures. The contact structures are used for connecting storage nodes. A material of the contact structures includes metal silicide.

BRIEF DESCRIPTION OF THE DRAWINGS

In order to more clearly illustrate the technical solutions in the embodiments of the disclosure or conventional technologies, the drawings used in the technical description of the embodiments will be briefly described below. It is apparent that the drawings in the following descriptions are merely some embodiments of the disclosure. Other drawings can be obtained by those skilled in the art according to these drawings without any creative work.

Figure 1A:
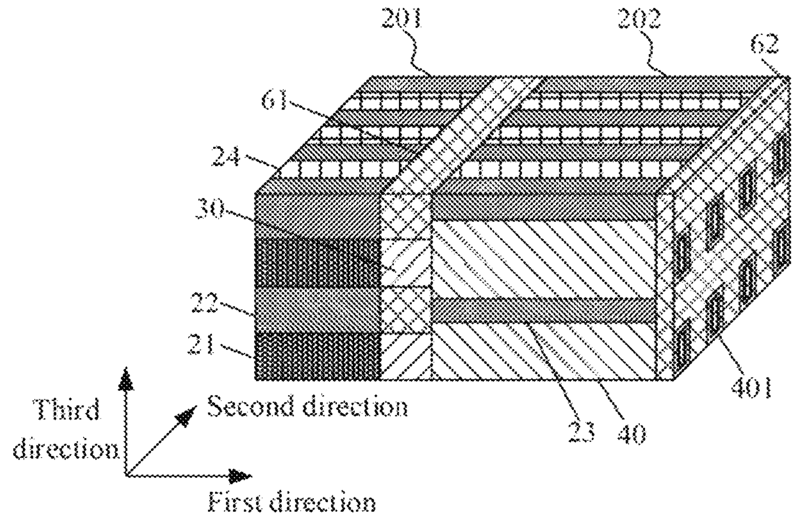
FIG. 1A is a three-dimensional view of a semiconductor structure according to an embodiment of the present disclosure.

Reference numerals are illustrated as follows:

10—Substrate;

21—Semiconductor layer; 22—First insulation layer; 23—Second insulation layer; 24—Vertical insulation layer; 241—First vertical insulation layer; 242—Second vertical insulation layer; 210—First semiconductor material layer; 220—Second semiconductor material layer; 201—First area; 202—Second area; 203—Trench; 204—Opening;

30—Contact structure;

40—Storage node; 401—Capacitor hole; 41—First electrode; 42—Dielectric layer;

43—Second electrode;

50—Conductive layer;

61—First support structure; 62—Second support structure; 63—Third support structure.

DETAILED DESCRIPTION

Exemplary embodiments disclosed in the disclosure are described in more detail with reference to drawings.

Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference sign represents the same element throughout.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may exist. In contrast, while the element is referred to as being "directly on", "directly adjacent to", "directly connected to" or "directly coupled to" other elements or layers, the intermediate element or layer does not exist. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily existent in the disclosure.

Terms regarding the spatial relation, such as "under", "below", "lower", "underneath", "above", "upper" and the like, may be used here for convenient description so as to describe a relationship between one element or one feature shown in the drawings and other elements or features. It should be understood that in addition to orientations shown in the drawings, the terms of spatial relation are intended to further include different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or in other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In order to understand the disclosure thoroughly, detailed steps and detailed structures are presented in the following description, so as to explain the technical solutions of the disclosure. Preferred embodiments of the disclosure are described in detail below, and the disclosure however may also have other implementations in addition to these detailed descriptions.

Figure 1B:
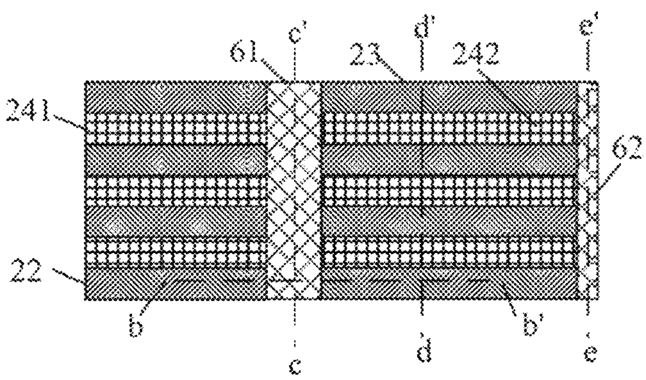
FIG. 1B is a top view of a semiconductor structure according to an embodiment of the present disclosure.
Figure 1C:
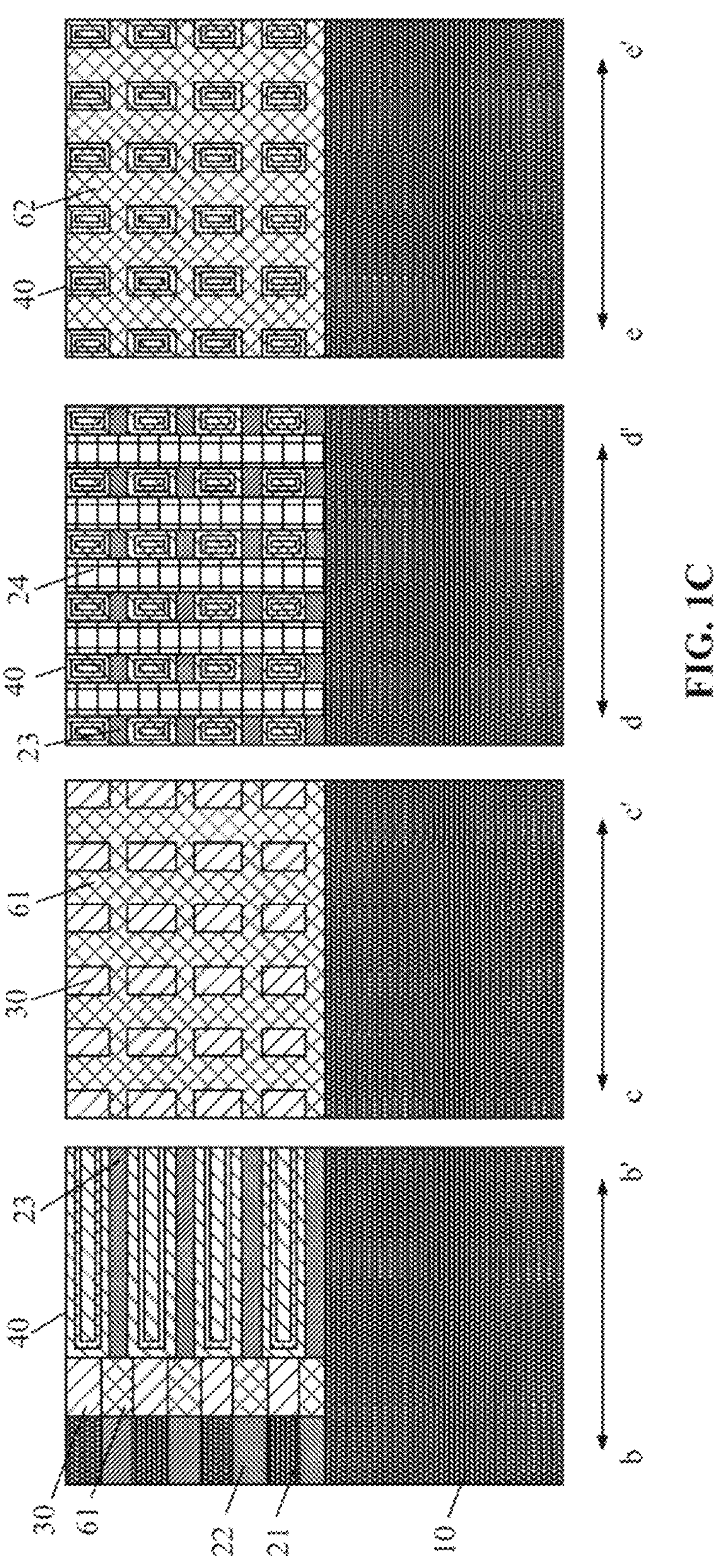
FIG. 1C is a cross-sectional view along each angle of view in FIG. 1B.

Based on this, embodiments of the present disclosure provide a semiconductor structure. FIG. 1A is a three-dimensional view of a semiconductor structure according to an embodiment of the present disclosure. FIG. 1B is a top view of a semiconductor structure according to an embodiment of the present disclosure. FIG. 1C is a cross-sectional view along each angle of view in FIG. 1B.

Referring to FIG. 1A to FIG. 1C, the semiconductor structure includes a substrate 10, a stacked structure, a plurality of contact structures 30 and a plurality of storage nodes 40.

The stacked structure is located on the substrate 10 and includes a plurality of semiconductor layers 21 that extend in a first direction and are arranged in a spaced manner in a second direction and in a third direction. The first direction and the second direction are directions parallel to a plane where the substrate 10 is located. The first direction is perpendicular to the second direction. The third direction is a direction perpendicular to the plane where the substrate 10 is located.

Each contact structure 30 includes a first end and a second end in the first direction. The first end of each contact structure 30 is connected to a respective one of the plurality of semiconductor layers 21. A material of the plurality of contact structures 30 includes metal silicide.

The plurality of storage nodes 40 extend in the first direction and each storage node is connected to the second end of a respective one of the plurality of contact structures 30.

In the embodiments of the present disclosure, the contact structures connected to the corresponding semiconductor layers and the storage nodes connected to the contact structures can be formed by means of self-alignment, and the material of the contact structures is metal silicide. In this way, when the subsequently-formed storage nodes are connected to the contact structures, contact resistance can be reduced.

In an embodiment, the substrate 10 may be a silicon substrate, a germanium substrate, a silicon germanium substrate, a silicon carbide substrate, a Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as Si—Ge On Insulator (SGOI).

In an embodiment, the semiconductor structure further includes Bit Lines (BL), which is not shown. The BLs are located on ends of the semiconductor layers 21 far from the contact structures 30. A material of the BLs include tungsten (W), copper (Cu), titanium (Ti), tantalum (Ta), titanium nitride (TiN), tantalum nitride (TaN), metal silicides, metal alloys, or any combination thereof.

Word lines (WL, not shown) and storage unit transistors (not shown) may be formed in the semiconductor layers 21. Gate electrodes of the storage unit transistors may be connected to the WLs. Sources of the storage unit transistors may be connected to the BL; and drains of the storage unit transistors may be connected to the contact structure.

A material of the WLs includes tungsten (W), copper (Cu), titanium (Ti), tantalum (Ta), titanium nitride (TiN), tantalum nitride (TaN), metal silicides, metal alloys, or any combination thereof.

In an embodiment, the material of the semiconductor layers 21 includes, but is not limited to, silicon.

In an embodiment, the material of the plurality of contact structures includes cobalt silicide or titanium silicide. The cobalt silicide or titanium silicide is used as the material of the contact structures. In this way, when the storage nodes are in contact with the contact structures subsequently, contact resistance can be reduced.

Figure 1D:
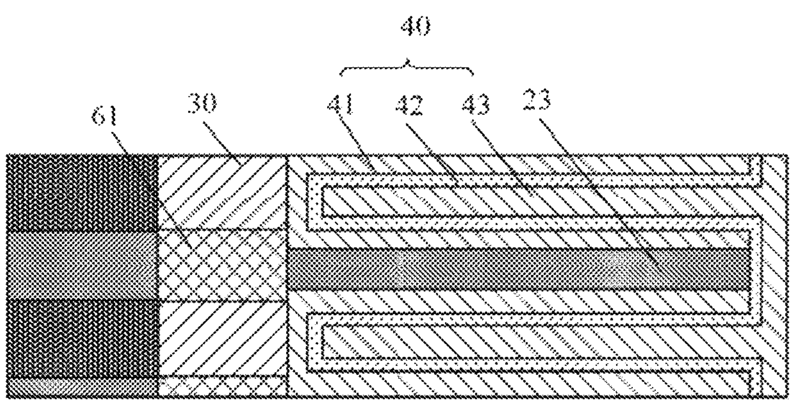
FIG. 1D is a schematic structural diagram of a storage node of the semiconductor structure in FIG. 1A.
Figure 2A:
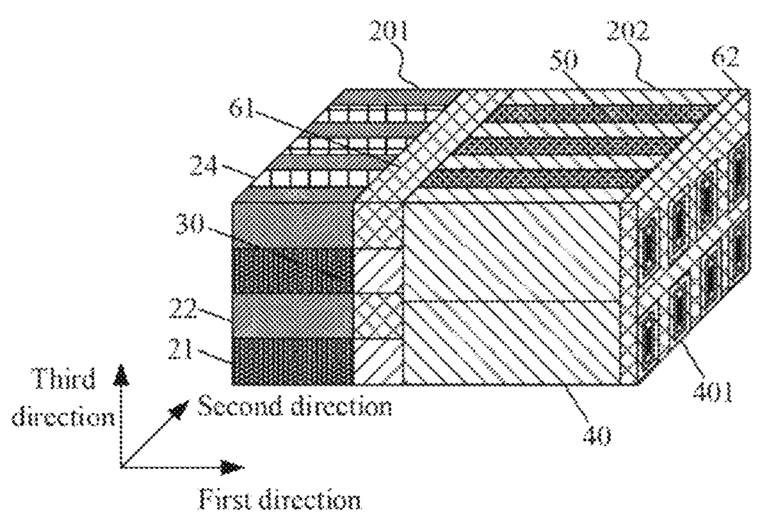
FIG. 2A is a three-dimensional view of a semiconductor structure according to another embodiment of the present disclosure.
Figure 2B:
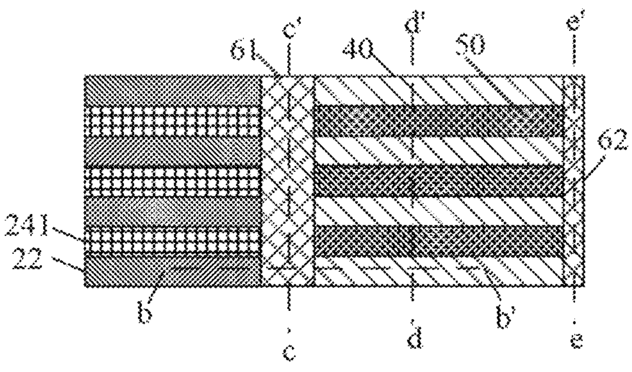
FIG. 2B is a top view of a semiconductor structure according to another embodiment of the present disclosure.
Figure 2C:
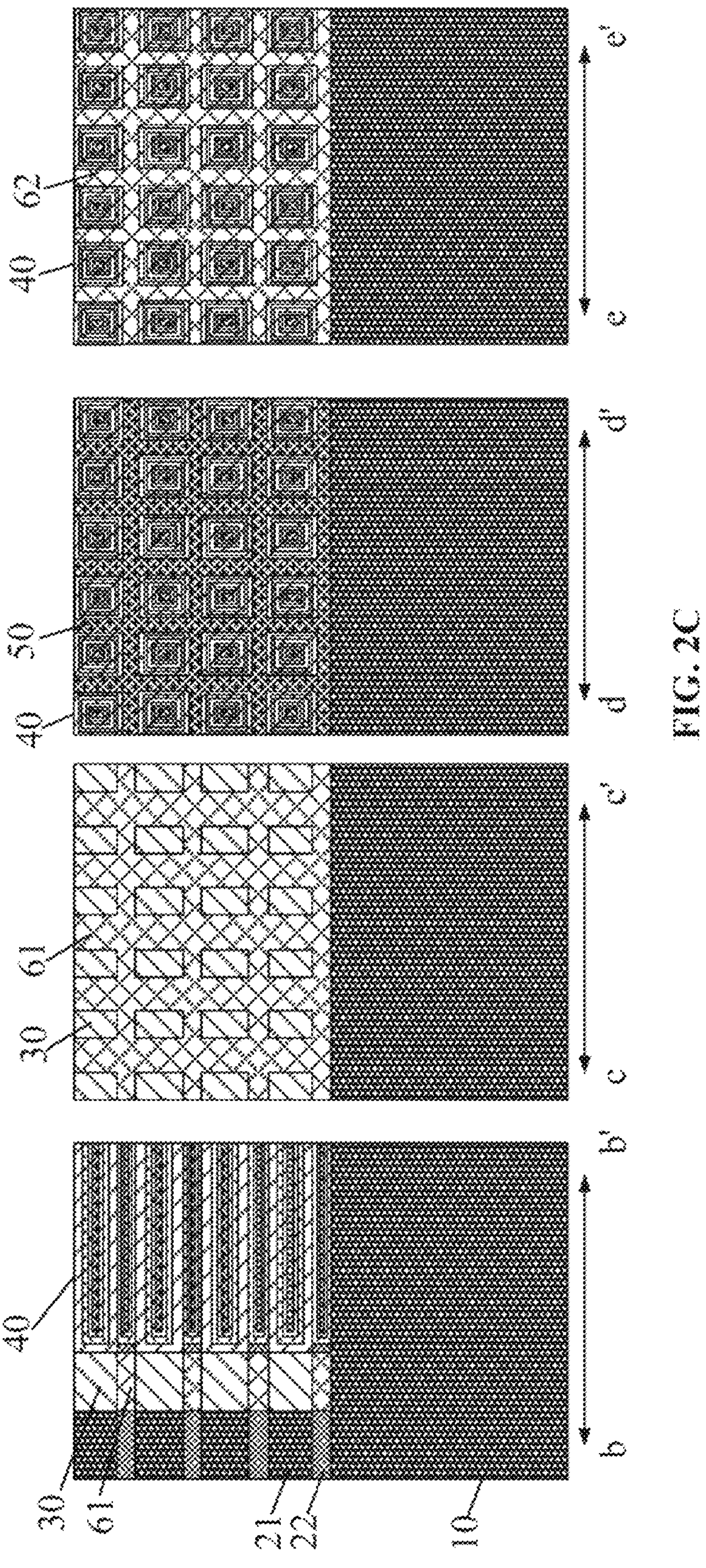
FIG. 2C is a cross-sectional view along each angle of view in FIG. 2B.
Figure 2D:
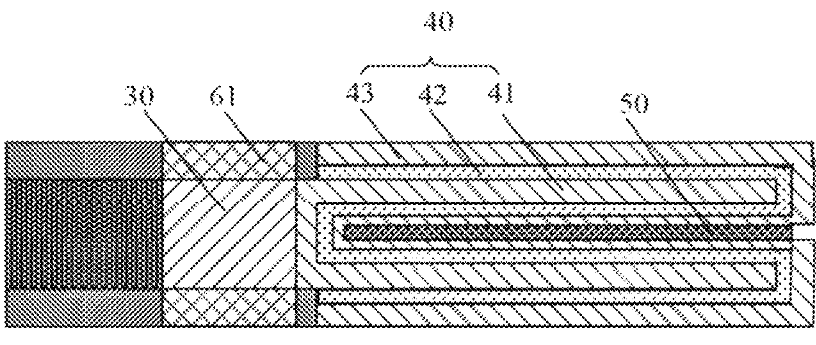
FIG. 2D is a schematic structural diagram of a storage structure of the semiconductor structure in FIG. 2A.

FIG. 1D is a schematic structural diagram of a storage node of the semiconductor structure in FIG. 1A. FIG. 2A is a three-dimensional view of a semiconductor structure according to another embodiment of the present disclosure. FIG. 2B is a top view of a semiconductor structure according to another embodiment of the present disclosure. FIG. 2C is a cross-sectional view along each angle of view in FIG. 2B. FIG. 2D is a schematic structural diagram of a storage structure of the semiconductor structure in FIG. 2A. It is to be noted that, the storage node of the semiconductor structure in FIG. 1A to FIG. 1D is different from a structure of a contact node in the semiconductor structure in FIG. 2A to FIG. 2D.

In an embodiment, the semiconductor structure further includes capacitor holes 401. The capacitor holes 401 extend in the first direction.

A storage node 40 is located in a respective one of the capacitor holes 401, and each storage node includes a first electrode 41, a dielectric layer 42 and a second electrode 43. The first electrode 41 extends in the first direction and is connected to the second end of a respective one of the contact structures 30.

A material of the first electrode 41 and the second electrode 43 includes one or more of W, Cu, Ti, Ta, TiN, TaN, metal silicides, or metal alloys, for example, the TiN.

A material of the dielectric layer 42 includes a high-K dielectric material. The high-K dielectric material may include a hafnium element. Specifically, the high-K dielectric material may include, but is not limited to, Aluminum Oxide ($Al_2O_3$), Tantalum Oxide ($Ta_2O_3$), Titanium Oxide ($TiO_2$), Yttrium Oxide ($Y_2O_3$), Zirconium Oxide ($ZrO_2$), Zirconium Silicon Oxide ($ZrSi_xO_y$), Hafnium Oxide ($HfO_2$), Hafnium Silicon Oxide ($HfSi_xO_y$), Hafnium Silicon Oxynitride (HfSiON), Hafnium Zirconate ($HfZrO_4$), Lanthanum Oxide ($La_2O_3$), Lanthanum Aluminum Oxide ($LaAl_xO_y$), Lanthanum Hafnium Oxide ($LaHf_xO_y$), Hafnium Aluminum Oxide ($HfAl_xO_y$) and/or Praseodymium Oxide ($Pr_2O_3$).

Reference is first made to the semiconductor structure shown in FIG. 1A to FIG. 1D.

As shown in FIG. 1D, the first electrode 41 covers an inner wall of the capacitor hole 401. The dielectric layer 42 covers an inner wall of the first electrode 41 and an end face of the first electrode 41 that is far from the contact structure 30 in the first direction. The second electrode 43 covers an inner wall of the dielectric layer 42, and is filled in the capacitor hole 401.

In this embodiment, the storage node forms a single-sided capacitor structure.

In an embodiment, in the first direction, the stacked structure includes a first area 201 and a second area 202 that are located on two sides of the contact structure 30.

The semiconductor structure further includes first insulation layers 22 and second insulation layers 23.

Each first insulation layer 22 is located between two adjacent semiconductor layers 21 in a third direction within the first area 201.

Each second insulation layer 23 is located between two adjacent storage nodes in the third direction within the second area 202.

The width of the second insulation layer 23 in the third direction ranges from to 10 nm.

By means of setting the width of the second insulation layer to 5 nm to 10 nm, the leakage current of a capacitor can be reduced, the loss of sensing margin can be reduced, and the volume of the storage node 40 can be guaranteed, thereby avoiding space waste.

The material of the first insulation layer 22 and the second insulation layer 23 may include one or more of oxides (such as silicon oxide), nitrides (such as silicon nitride) and nitrogen oxides (such as silicon nitride).

Referring to FIG. 1A and FIG. 1B, the semiconductor structure further includes a vertical insulation layer 24. The vertical insulation layer 24 penetrates the stacked structure, and includes a first vertical insulation layer 241 located in the first area 201 and a second vertical insulation layer 242 located in the second area 202. The first vertical insulation layer 241 is located between two adjacent semiconductor layers 21 and two adjacent first insulation layers 22 in the second direction. The second vertical insulation layer 242 is located between two adjacent storage nodes 40 and two adjacent second insulation layers 23 in the second direction.

The material of the vertical insulation layer 24 may include one or more of oxides (such as silicon oxide), nitrides (such as silicon nitride) and nitrogen oxides (such as silicon nitride).

In an embodiment, the semiconductor structure further includes a first support structure 61. The first support structure 61 covers sidewalls of the contact structures 30 in the second direction and in the third direction, and is filled between two adjacent contact structures 30.

The first support structure can play a role of supporting the contact structure, and can also play a role of insulation isolation to isolate the adjacent contact structures.

The semiconductor structure further includes a second support structure 62. The second support structure 62 is located at an end portion of the storage nodes 40 far from the contact structures 30. The second support structure 62 covers partial sidewalls of the storage nodes 40 in the second direction and in the third direction, and is filled between the end portions of two adjacent storage nodes 40.

The second support structure can play a role of supporting the storage nodes, such that a device is not easy to collapse.

The material of the first support structure 61 and the second support structure 62 includes, but is not limited to silicon nitride (SiN).

Next, reference is made to the semiconductor structure shown in FIG. 2A to FIG. 2D.

In an embodiment, as shown in FIG. 2D, the first electrode 41 has a cup shape with an opening in the first direction. The dielectric layer 42 covers the inner wall and outer wall of the first electrode 41. The second electrode 43 covers the inner wall and outer wall of the dielectric layer 42.

In this embodiment, the storage node forms a double-sided capacitor structure. The double-sided capacitor structure can have a larger electric capacity.

In an embodiment, in the first direction, the stacked structure includes a first area 201 and a second area 202 that are located on two sides of the contact structure 30.

The semiconductor structure further includes first insulation layers 22. Each first insulation layer 22 is located between two adjacent semiconductor layers 21 in a third direction within the first area 201.

In this embodiment, the second area does not include the second insulation layers.

Referring to FIG. 2A and FIG. 2B, the semiconductor structure further includes vertical insulation layer 24*s*. The vertical insulation layers 24 penetrate the stacked structure, and include first vertical insulation layers 241 located in the first area 201 The first vertical insulation layer 241 is located between two adjacent semiconductor layers 21 and two adjacent first insulation layers 22 in the second direction.

In this embodiment, the vertical insulation layer 24 only includes the first vertical insulation layer 241, and does not include the second vertical insulation layer located in the second area.

In an embodiment, the semiconductor structure further includes: a conductive layer 50. The conductive layer 50 covers the inner wall of the second electrode 43, is filled in the capacitor holes 401 and is filled in the gap between any adjacent storage nodes 40.

The conductive layer may be used as a conductive material and connects a plurality of second electrodes together in parallel, such that a plurality of storage nodes can be simultaneously controlled subsequently, and capacitor pillar may also be stabilized.

The material of the conductive layer 50 includes, but is not limited to, polysilicon. The polysilicon layer may further be doped with one or more of boron, arsenic, phosphorus and germanium.

Figure 3:
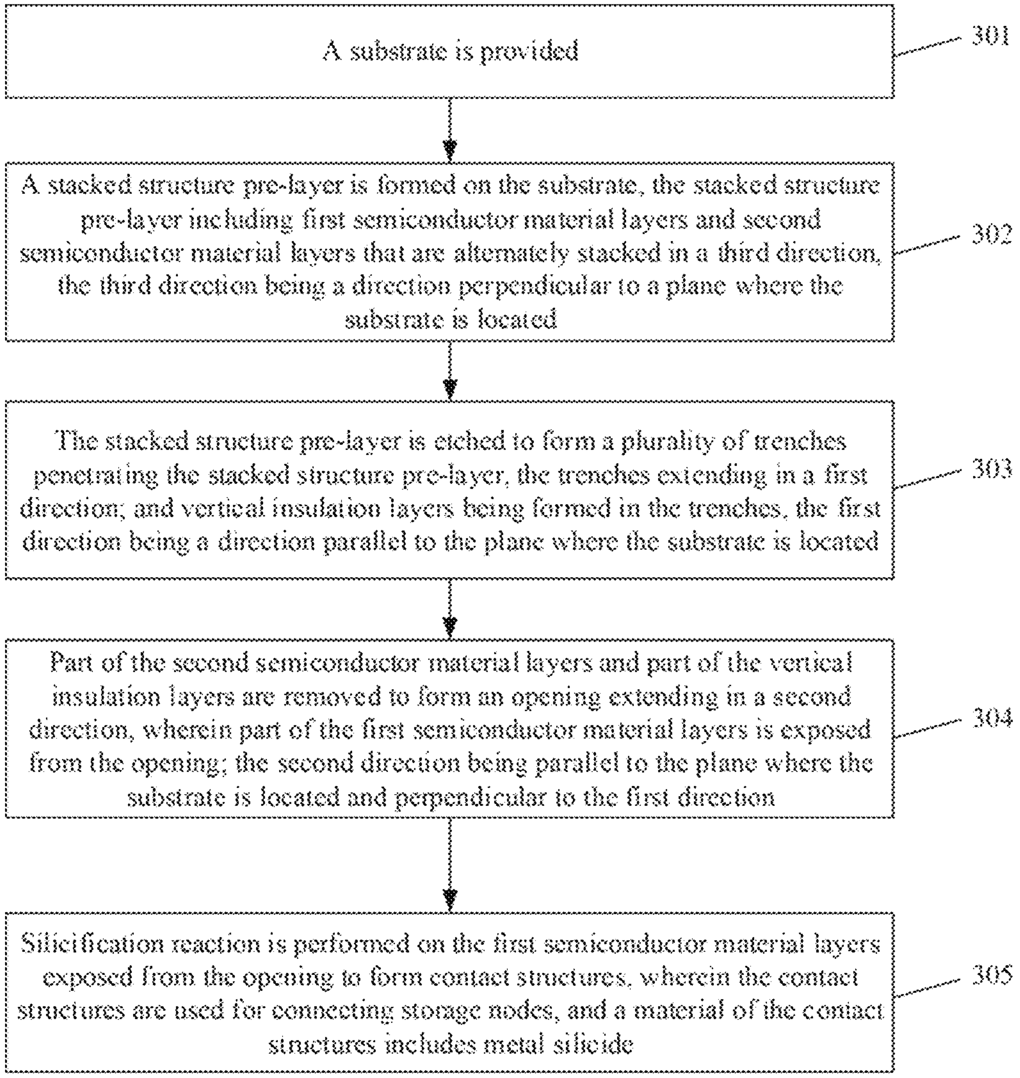
FIG. 3 is a schematic flowchart of a method for manufacturing a semiconductor structure according to an embodiment of the present disclosure.

An embodiment of the present disclosure further provides a method for manufacturing a semiconductor structure. Referring to FIG. 3 for details, as shown in the figure, the method includes the following operations S301, S302, S303, S304.

At S301, a substrate is provided.

At S302, a stacked structure pre-layer is formed on the substrate. The stacked structure pre-layer includes first semiconductor material layers and second semiconductor material layers that are alternately stacked in a third direction. The third direction is a direction perpendicular to a plane where the substrate is located.

At S303, the stacked structure pre-layer is etched to form a plurality of trenches penetrating the stacked structure pre-layer. The trenches extend in a first direction; and vertical insulation layers are formed in the trenches. The first direction is a direction parallel to the plane where the substrate is located.

At S304, part of the second semiconductor material layers and part of the vertical insulation layers are removed to form an opening extending in a second direction. Part of the first semiconductor material layers is exposed from the opening. The second direction is parallel to the plane where the substrate is located and perpendicular to the first direction.

At S305, a silicification reaction is performed on the first semiconductor material layers exposed from the opening to form contact structures. The contact structures are used for connecting storage nodes. A material of the contact structures includes metal silicide.

The method for manufacturing a semiconductor structure provided in the embodiments of the disclosure is further described in detail below with reference to specific embodiments.

FIG. 4A to FIG. 4M are schematic structural diagrams of a semiconductor structure during manufacturing according to an embodiment of the present disclosure. FIG. 5A to FIG. 5C are schematic diagrams of a semiconductor structure during manufacturing according to another embodiment of the present disclosure. It is to be noted that, in the embodiment shown in FIG. 5A to FIG. 5C, steps before FIG. 5A are consistent with that shown in FIG. 4A to FIG. 4J. In the embodiment shown in FIG. 4A to FIG. 4M and the embodiment shown in FIG. 5A to FIG. 5C, the structures of the storage nodes are different.

First referring to FIG. 4A to FIG. 4M, one of the embodiments of the method for manufacturing a semiconductor structure is described in detail.

First, S301 is executed. The substrate is provided. It is to be noted that, the substrate is not shown in the schematic structural diagrams in FIG. 4A to FIG. 4M, but referring to FIG. 1C, all structures are all formed on the substrate subsequently.

In an embodiment, the substrate may be a silicon substrate, a germanium substrate, a silicon germanium substrate, a silicon carbide substrate, an SOI substrate, or a GOI substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SGOI.

Figure 4A:
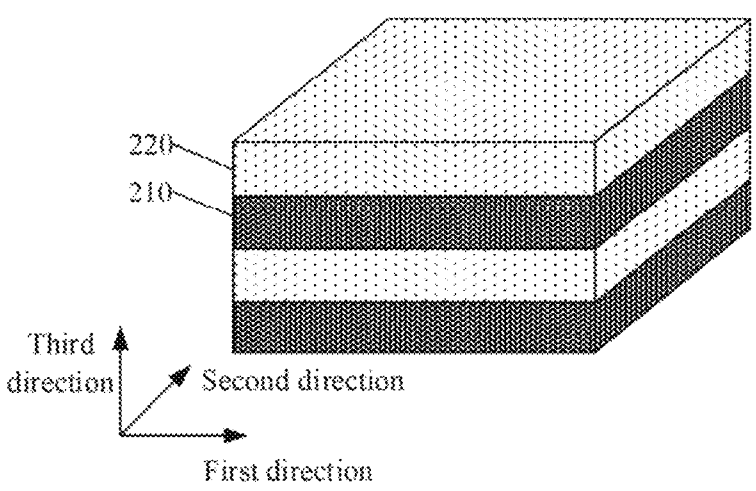
FIG. 4A to FIG. 4M are schematic structural diagrams of a semiconductor structure during manufacturing according to an embodiment of the present disclosure.
Figure 5A:
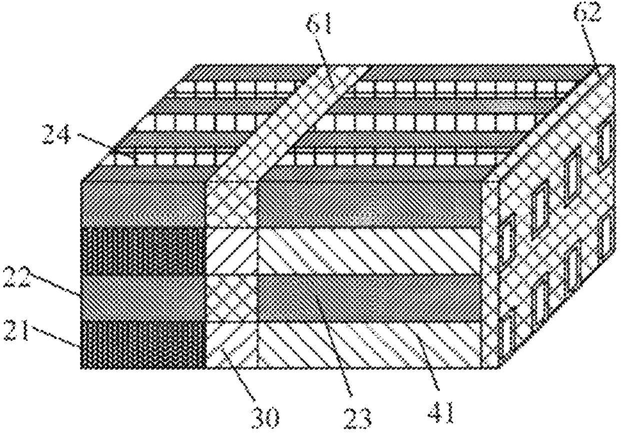
FIG. 5A to FIG. 5C are schematic diagrams of a semiconductor structure during manufacturing according to another embodiment of the present disclosure.
Figure 5B:
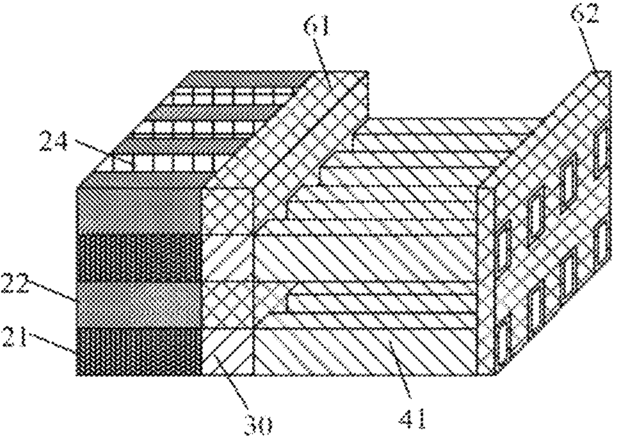
Figure 5C:
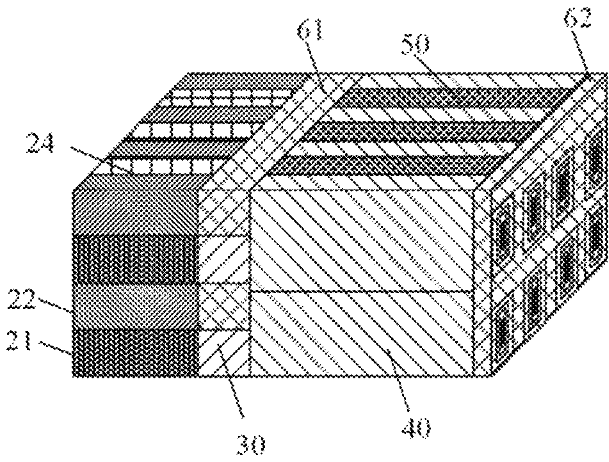

Next, referring to FIG. 4A, S302 is executed. The stacked structure pre-layer is formed on the substrate 10. The stacked structure pre-layer includes first semiconductor material layers 210 and second semiconductor material layers 220 that are alternately stacked in a third direction. The third direction is a direction perpendicular to a plane where the substrate 10 is located.

It is to be noted that, the first direction, the second direction and the third direction mentioned in the following steps are consistent with the first direction, the second direction and the third direction shown in FIG. 4A.

In practical operations, the first semiconductor material layers 210 and the second semiconductor material layers 220 may be formed by using one or more thin film deposition processes. Specifically, the deposition processes include, but are not limited to, a Chemical Vapor Deposition (CVD) process, a Plasma Enhanced Chemical Vapor Deposition (PECVD) process, an Atomic Layer Deposition (ALD) process, or a combination thereof.

A material of the first semiconductor material layers 210 includes, but is not limited to, silicon. A material of the second semiconductor material layers 220 includes, but is not limited to, silicon germanium.

Figure 4B:
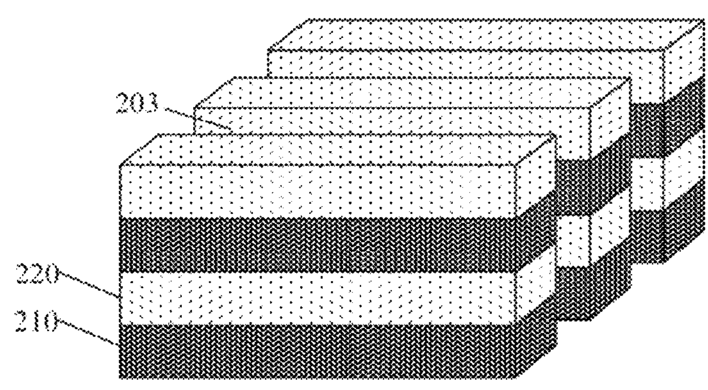
Figure 4C:
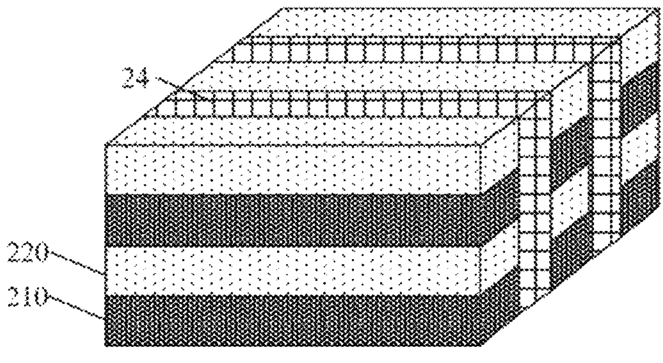

Next, referring to FIG. 4B and FIG. 4C, S303 is executed. The stacked structure pre-layer is etched to form a plurality of trenches 203, each trench penetrating the stacked structure pre-layer. The trenches 203 extend in a first direction; and a vertical insulation layer 24 is formed in each of the trenches 203. The first direction is a direction parallel to the plane where the substrate 10 is located.

Specifically, a mask layer may be first grown on an upper surface of the stacked structure pre-layer. Next, the mask layer is patterned to display, on the mask layer, a trench pattern to be etched. The mask layer may be patterned by means of photolithography. The mask layer may be photoresist mask or hard mask patterned based on photolithographic mask. When the mask layer is the photoresist mask, the mask layer is specifically patterned by means of steps of exposure, development and degumming. Next, the trenches 203 penetrating the stacked structure pre-layer are etched according to the trench pattern to be etched.

Specifically, the trenches 203 may be formed by means of a dry etching process.

In practical operation, the vertical insulation layers 24 may be formed by means of one or more thin film deposition processes. Specifically, the deposition processes include, but are not limited to, a Chemical Vapor Deposition (CVD) process, a Plasma Enhanced Chemical Vapor Deposition (PECVD) process, an Atomic Layer Deposition (ALD) process, or a combination thereof.

In an embodiment, the material of the vertical insulation layers 24 may include one or more of oxides (such as silicon oxide), nitrides (such as silicon nitride) and nitrogen oxides (such as silicon nitride).

Figure 4D:
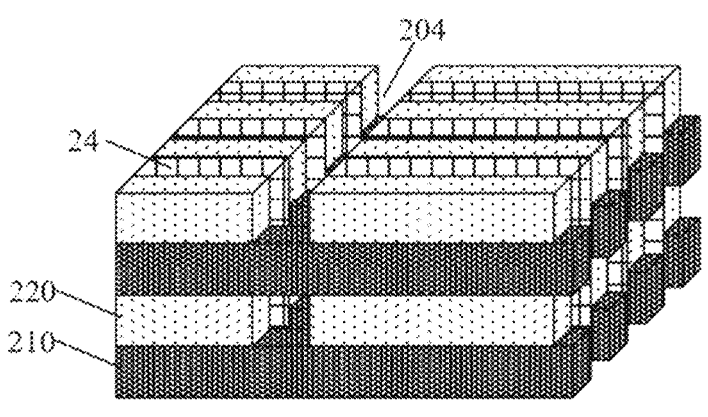

Next, referring to FIG. 4D, S304 is executed. Part of the second semiconductor material layers 220 and part of the vertical insulation layers 24 are removed, to form an opening 204 extending in the second direction. Part of the first semiconductor material layers 210 is exposed from the opening 204. The second direction is parallel to the plane where the substrate 10 is located and perpendicular to the first direction.

Continuously referring to FIG. 4D, while the opening 204 is formed, part of the second semiconductor material layers 220 and part of the vertical insulation layers 24 are removed at the end portion of the stacked structure pre-layer in the first direction, and part of the first semiconductor material layers 210 is exposed. Subsequently, the second support structure warping the exposed first semiconductor material layers 210 is formed at this exposure position.

Figure 4E:
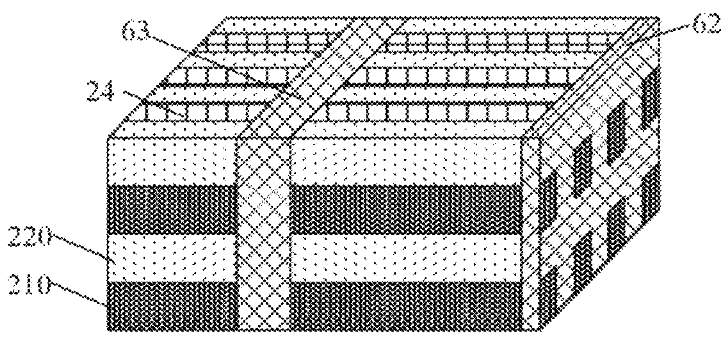

Next, referring to FIG. 4E, the opening 204 is filled to form a third support structure 63. The third support structure 63 covers the exposed first semiconductor material layers 210. The third support structure 63 provides support for a subsequent process for removing the remaining second semiconductor material layers 220 and forming insulation layers at the positions where the second semiconductor material layers are removed, and acts as a stop layer.

The material of the third support structure 63 includes, but is not limited to silicon nitride (SiN).

Continuously referring to FIG. 4E, a second support structure 62 is formed at the end portion of the stacked structure pre-layer in the first direction.

The material of the second support structure 62 includes, but is not limited to silicon nitride (SiN).

In practical operation, the second support structure 62 and the third support structure 63 may be formed by means of one or more thin film deposition processes. Specifically, the deposition processes include, but are not limited to, a Chemical Vapor Deposition (CVD) process, a Plasma Enhanced Chemical Vapor Deposition (PECVD) process, an Atomic Layer Deposition (ALD) process, or a combination thereof.

Figure 4F:
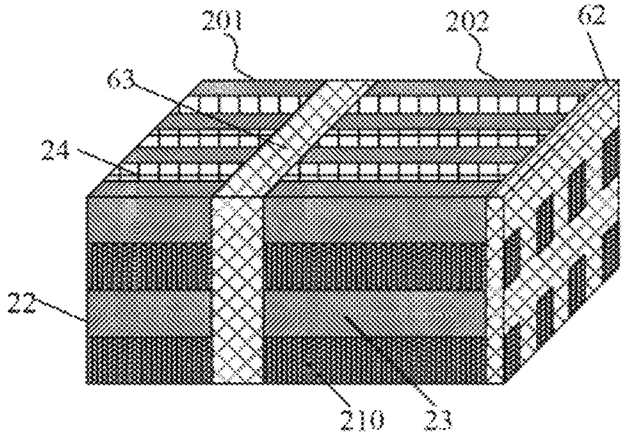

Next, referring to FIG. 4F, the opening 204 divides the stacked structure pre-layer into the first area 201 and the second area 202.

After the opening 204 is formed, the remaining second semiconductor material layer 220*s* are removed by means of etching.

Insulation layer is formed at positions where the second semiconductor material layers 220 are removed by means of etching. The insulation layers includes first insulation layers 22 located in the first area 201 and second insulation layers 23 located in the second area 202.

In practical operation, the vertical insulation layers 24 are required to be removed first by means of etching, so as to expose the second semiconductor material layers 220 in the stacked structure pre-layer. Then the remaining second semiconductor material layers 220 are removed. The insulation layers are then formed at the positions where the second semiconductor material layers 220 are removed, and at the same time, the vertical insulation layers 24 are formed again at the positions where the vertical insulation layers 24 are removed.

In practical operation, the first insulation layers 22 and the second insulation layers 23 may be formed by means of one or more thin film deposition processes. Specifically, the deposition processes include, but are not limited to, a Chemical Vapor Deposition (CVD) process, a Plasma Enhanced Chemical Vapor Deposition (PECVD) process, an Atomic Layer Deposition (ALD) process, or a combination thereof.

In this embodiment, before the contact structures are formed, the second semiconductor material layers are required to be first removed, because the metal material in the contact structures reacts with the material in the second semiconductor material layers. For example, cobalt or titanium reacts with silicon germanium.

The material of the first insulation layers 22 and the second insulation layers 23 may include one or more of oxides (such as silicon oxide), nitrides (such as silicon nitride) and nitrogen oxides (such as silicon nitride).

Figure 4G:
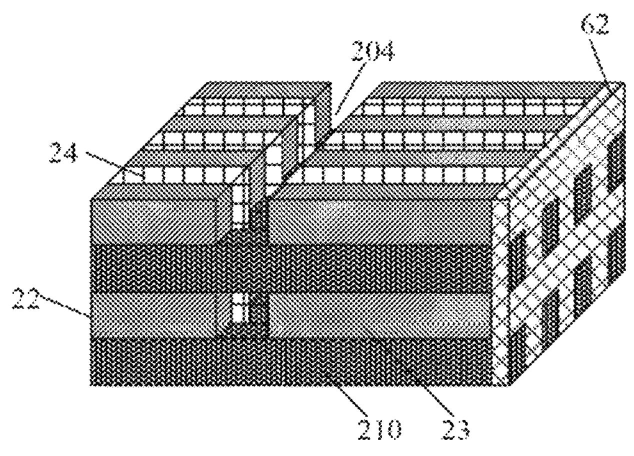

Next, referring to FIG. 4G, the third support structure 63 is removed to expose partial first semiconductor material layer 210 again.

Figure 4H:
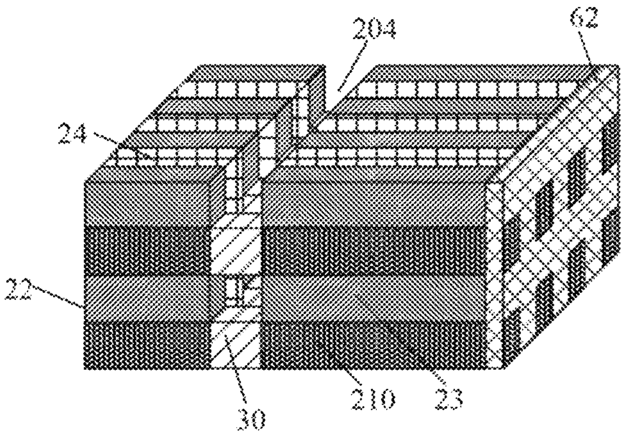

Next, referring to FIG. 4H, S305 is executed. The silicification reaction is performed on the first semiconductor material layers 210 exposed from the opening 204, to form contact structures 30. The contact structures 30 are used for connecting storage nodes. A material of the contact structures 30 includes metal silicide.

In the embodiments of the present disclosure, the contact structures are formed by performing the silicification reaction on the first semiconductor material layers exposed from the opening, without need of forming the contact structures when the storage nodes are formed subsequently. In the embodiments, when the storage nodes are formed subsequently, the contact structures can also be used as the stop layer to form the storage nodes by means of self-alignment. In addition, the material of the contact structures is metal silicide, such that when the subsequently-formed storage nodes are connected to the contact structures, contact resistance can be reduced.

In practical operation, a metal is first pre-cleaned before being deposited, and then is deposited; and primary Rapid Thermal Processing (RTP) is performed. The metal is doped into the exposed first semiconductor material layers to react with the exposed first semiconductor material layers, so that the material of the first semiconductor material layers is converted into metal silicide. Then, the unreacted metal is removed and secondary RTP is performed, so as to make the reaction more sufficient.

In an embodiment, the material of the contact structures 30 includes cobalt silicide or titanium silicide.

Figure 4I:
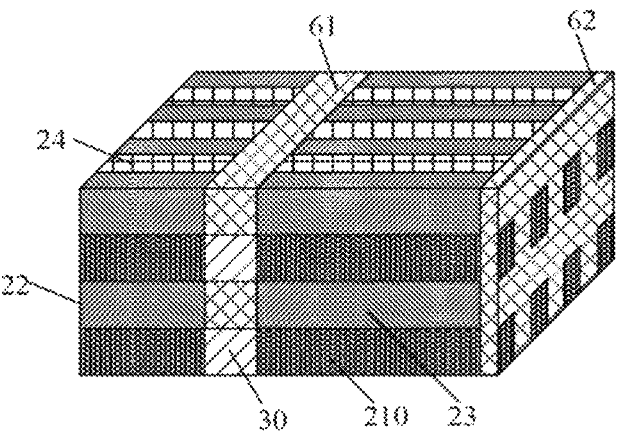

Next, referring to FIG. 4I, after the contact structures 30 are formed, the method further includes the following operation.

A first support structure 61 is filled in the opening 204. The first support structure 61 covers sidewalls of the contact structures 30 in the second direction and in the third direction.

In practical operation, the first support structure 61 may be formed by means of one or more thin film deposition processes. Specifically, the deposition processes include, but are not limited to, a Chemical Vapor Deposition (CVD) process, a Plasma Enhanced Chemical Vapor Deposition (PECVD) process, an Atomic Layer Deposition (ALD) process, or a combination thereof.

The first support structure can play a role of supporting the contact structures, and can also play a role of insulation isolation to isolate the adjacent contact structures.

The material of the first support structure 61 includes, but is not limited to silicon nitride (SiN).

Next, referring to FIG. 4J to FIG. 4M, after the contact structures 30 are formed, the method further includes the following operations.

The first semiconductor material layers 210 located in the second area 202 are removed by means of etching, to form capacitor holes 401, and the first semiconductor material layers 210 located in the first area 201 are formed into semiconductor layers 21.

A storage node 40 is formed in a respective one of the capacitor holes 401. Each storage node 40 includes a first electrode 41, a dielectric layer 42 and a second electrode 43. The first electrode 41 extends in the first direction and is connected to a respective one of the contact structures 30.

Figure 4J:
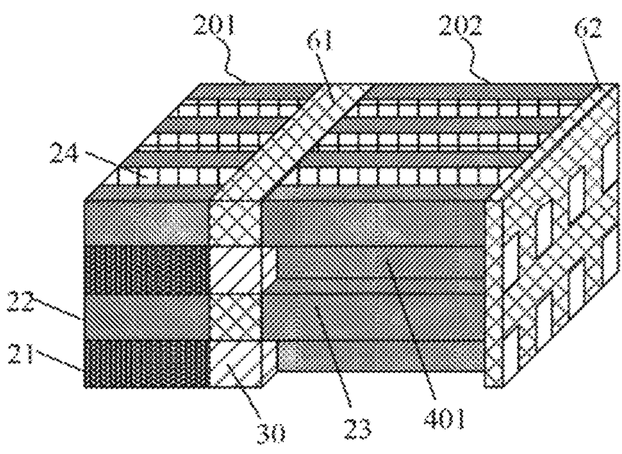

First referring to FIG. 4J, the first semiconductor material layers 210 in the second area are removed by means of etching, to form the capacitor holes 401.

The method further includes: forming Bit Lines (BL) (not shown) on ends of the semiconductor layers 21 far from the contact structures 30. A material of the BLs includes tungsten (W), copper (Cu), titanium (Ti), tantalum (Ta), titanium nitride (TiN), tantalum nitride (TaN), metal silicides, metal alloys, or any combination thereof.

Word lines (WL) (not shown) and storage unit transistors (not shown) are formed in the semiconductor layers 21. Gate electrodes of the storage unit transistors may be connected to the WLs. Sources of the storage unit transistors may be connected to the BL; and drains of the storage unit transistors may be connected to the contact structure.

A material of the WLs includes tungsten (W), copper (Cu), titanium (Ti), tantalum (Ta), titanium nitride (TiN), tantalum nitride (TaN), metal silicides, metal alloys, or any combination thereof.

Figure 4K:
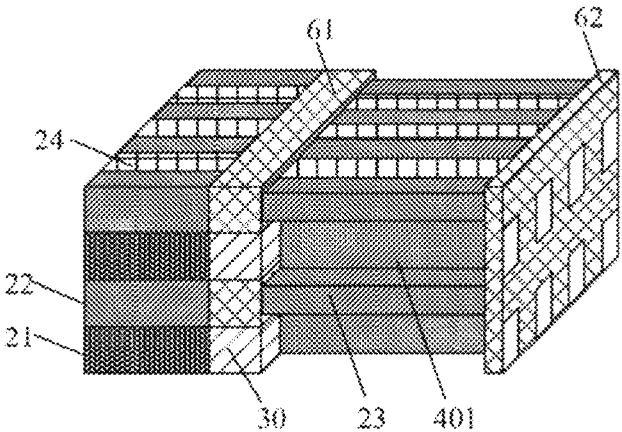

Next, referring to FIG. 4K, before the storage nodes 40 are formed, the second insulation layers 23 are thinned, to cause the width of the thinned second insulation layers 23 in the third direction to range from 5 nm to 10 nm.

By means of setting the width of the second insulation layers to a range from to 10 nm, the leakage current of a capacitor can be reduced, and the loss of sensing margin can be reduced.

Continuously referring to FIG. 4K, after the second insulation layers 23 are thinned, the width of the capacitor hole 401 in the third direction is increased. Since the width of the capacitor hole is increased, the electric capacity of the subsequently-formed storage node is increased.

Figure 4L:
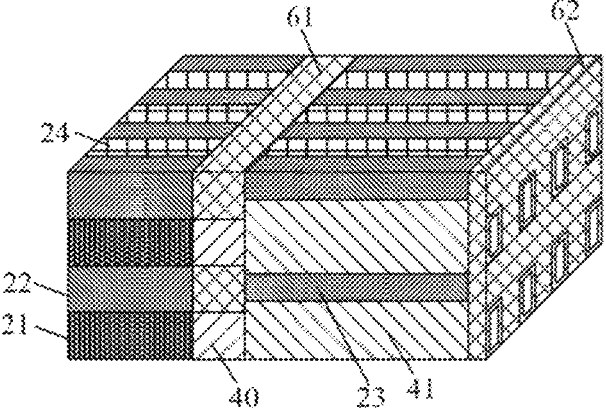
Figure 4M:
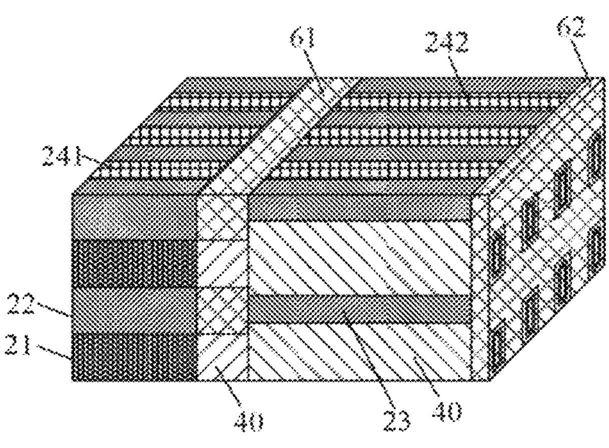

Next, referring to FIG. 4L and FIG. 4M, and FIG. 1D, the operation of forming the storage node 40 in the capacitor hole 401 includes the following operations.

The first electrode 41 is formed on an inner wall of the capacitor hole 401.

A dielectric layer 42 is formed on an inner wall of the first electrode 41 and an end face of the first electrode 41 that is away from the contact structure 30 in the first direction.

The second electrode 43 is formed on the inner wall of the dielectric layer 42, and the second electrode 43 is filled in the capacitor hole 401.

In this embodiment, the storage node forms a single-sided capacitor structure.

A material of the first electrode 41 and the second electrode 43 includes one or more of W, Cu, Ti, Ta, TiN, TaN, metal silicides, or metal alloys, for example, the TiN.

A material of the dielectric layer 42 includes a high-K dielectric material. The high-K dielectric material may include a hafnium element. Specifically, the high-K dielectric material may include, but not limited to, Aluminum Oxide ($Al_2O_3$), Tantalum Oxide ($Ta_2O_3$), Titanium Oxide ($TiO_2$), Yttrium Oxide ($Y_2O_3$), Zirconium Oxide ($ZrO_2$), Zirconium Silicon Oxide ($ZrSi_xO_y$), Hafnium Oxide ($HfO_2$), Hafnium Silicon Oxide ($HfSi_xO_y$), Hafnium Silicon Oxynitride (HfSiON), Hafnium Zirconate ($HfZrO_4$), Lanthanum Oxide ($La_2O_3$), Lanthanum Aluminum Oxide ($LaAl_xO_y$), Lanthanum Hafnium Oxide ($LaHf_xO_y$), Hafnium Aluminum Oxide ($HfAl_xO_y$) and/or Praseodymium Oxide ($Pr_2O_3$).

First referring to FIG. 5A to FIG. 5C, another embodiment of the method for manufacturing a semiconductor structure is described in detail.

It is to be noted that in this embodiment, FIG. 5A is the operation after FIG. 4J, and the operations before FIG. 5A will not be elaborated again.

Referring to FIG. 5A to FIG. 5C, after the first semiconductor material layers 210 located in the second area are removed by means of etching to form the capacitor holes 401, a storage node 40 is formed in each of the capacitor holes 401.

In an embodiment, referring to FIG. 2D, the operation of forming the storage in each of the capacitor holes 401 includes the following operations.

The first electrode 41 is formed on the inner wall of each capacitor hole 401. The first electrode 41 is in a cup shape with an opening in the first direction.

The dielectric layer 42 is formed on the inner wall and outer wall of the first electrode 41.

The second electrode 43 is formed on the inner wall and outer wall of the dielectric layer 42.

In this embodiment, the storage node forms a double-sided capacitor structure. The double-sided capacitor structure can form a larger electric capacity.

A material of the first electrode 41 and the second electrode 43 includes one or more of W, Cu, Ti, Ta, TiN, TaN, metal silicides, or metal alloys, for example, the TiN.

A material of the dielectric layer 42 includes a high-K dielectric material. The high-K dielectric material may include a hafnium element. Specifically, the high-K dielectric material may include, but not limited to, Aluminum Oxide ($Al_2O_3$), Tantalum Oxide ($Ta_2O_3$), Titanium Oxide ($TiO_2$), Yttrium Oxide ($Y_2O_3$), Zirconium Oxide ($ZrO_2$), Zirconium Silicon Oxide ($ZrSi_xO_y$), Hafnium Oxide ($HfO_2$), Hafnium Silicon Oxide ($HfSi_xO_y$), Hafnium Silicon Oxynitride (HfSiON), Hafnium Zirconate ($HfZrO_4$), Lanthanum Oxide ($La_2O_3$), Lanthanum Aluminum Oxide ($LaAl_xO_y$), Lanthanum Hafnium Oxide ($LaHf_xO_y$), Hafnium Aluminum Oxide ($HfAl_xO_y$) and/or Praseodymium Oxide ($Pr_2O_3$).

Referring to FIG. 5B, the method further includes that: after the first electrode 41 is formed, the second insulation layers 23 and the vertical insulation layers 24 in the second area 202 are removed by means of etching.

After the second insulation layers and the vertical insulation layers are removed, more space is used for forming the storage nodes, such that the electric capacity of the storage nodes can be larger.

Referring to FIG. 5C and FIG. 2D, after the second electrode 43 is formed, a conductive layer 50 is formed on the inner wall of the second electrode 43 and a gap between any adjacent storage nodes 40. The conductive layer 50 is filled in the capacitor holes 401.

The conductive layer may be used as a conductive material, and connect a plurality of second electrodes together in parallel, such that a plurality of storage nodes can be simultaneously controlled subsequently, and capacitor pillar may also be stabilized.

The material of the conductive layer 50 includes, but is not limited to, polysilicon. The polysilicon layer may further be doped with one or more of boron, arsenic, phosphorus and germanium.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

INDUSTRIAL APPLICABILITY

In the embodiments of the present disclosure, the contact structures connected to the corresponding semiconductor layers and the storage nodes connected to the contact structures can be formed by means of self-alignment. The material of the contact structures is metal silicide. In this way, when the subsequently-formed storage nodes are connected to the contact structures, contact resistance can be reduced.

What is claimed is:

1. A semiconductor structure, comprising:

a substrate;

a stacked structure, located on the substrate and comprising semiconductor layers that extend in a first direction and are arranged in a spaced manner in a second direction and in a third direction, wherein the first direction and the second direction are directions parallel to a plane where the substrate is located, the first direction is perpendicular to the second direction, and the third direction is a direction perpendicular to the plane where the substrate is located;

contact structures, each contact structure comprising a first end and a second end in the first direction, wherein the first end of each contact structure is connected to a respective one of the semiconductor layers, and a material of the contact structures comprises metal silicide;

storage nodes, extending in the first direction, each storage node comprises a first electrode being connected to the second end of a respective one of the contact structures, a dielectric layer and a second electrode; wherein the first electrode has a cup shape with an opening in the first direction; the dielectric layer covers an inner wall and an outer wall of the first electrode; and the second electrode covers an inner wall and an outer wall of the dielectric layer; and a conductive layer, covering an inner wall of the second electrode, filled in the capacitor holes and filled in a gap between any adjacent storage nodes.

2. The semiconductor structure of claim 1, wherein the material of the contact structures comprises cobalt silicide or titanium silicide.

3. The semiconductor structure of claim 1, further comprising:

a first support structure, covering sidewalls of the contact structures in the second direction and in the third direction, and filled between two adjacent contact structures.

4. The semiconductor structure of claim 1, further comprising:

capacitor holes, extending in the first direction, wherein each storage node is located in a respective one of the capacitor holes.

5. The semiconductor structure of claim 4, wherein the first electrode covers an inner wall of a capacitor hole;

the dielectric layer covers an inner wall of the first electrode and an end face of the first electrode that is far from the contact structure in the first direction; and the second electrode covers an inner wall of the dielectric layer and is filled in the capacitor hole.

6. The semiconductor structure of claim 5, wherein in the first direction, the stacked structure comprises a first area and a second area that are located on two sides of the contact structure;

the semiconductor structure further comprising:

first insulation layers, each first insulation layer being located between two adjacent semiconductor layers in the third direction within the first area; and second insulation layers, each second insulation layer being located between two adjacent storage nodes in the third direction within the second area, wherein a width of the second insulation layer in the third direction ranges from 5 nm to 10 nm.

7. A method for manufacturing a semiconductor structure, comprising:

providing a substrate;

forming a stacked structure pre-layer on the substrate, wherein the stacked structure pre-layer comprises first semiconductor material layers and second semiconductor material layers, wherein both the first semiconductor material layers and the second semiconductor material layers extend in a first direction and a second direction, the first semiconductor material layers and the second semiconductor material layers are alternately stacked in a third direction, the third direction being a direction perpendicular to a plane where the substrate is located;

etching the stacked structure pre-layer to form a plurality of trenches penetrating the stacked structure pre-layer, wherein the trenches extend in the first direction; and forming vertical insulation layers in the trenches, wherein the first direction is a direction parallel to the plane where the substrate is located;

removing part of the second semiconductor material layers and part of the vertical insulation layers to form an opening extending in the second direction, wherein part of the first semiconductor material layers is exposed from the opening, and the second direction is parallel to the plane where the substrate is located and perpendicular to the first direction, wherein the opening divides the stacked structure pre-layer into a first area and a second area;

performing a silicification reaction on the first semiconductor material layer exposed from the opening to form contact structures, wherein the contact structures are used for connecting storage nodes, and a material of the contact structures comprises metal silicide;

removing first semiconductor material layers located in the second area by means of etching to form capacitor holes, the first semiconductor material layers in the first area being formed into semiconductor layers; and forming a storage node in each of the capacitor holes, wherein the storage node comprises a first electrode, a dielectric layer and a second electrode, and the first electrode extends in the first direction and is connected to a respective one of the contact structures.

8. The method of claim 7, wherein the material of the contact structures comprises cobalt silicide or titanium silicide.

9. The method of claim 7, wherein after the contact structures are formed, the method further comprises:

filling a first support structure in the opening, wherein the first support structure covers sidewalls of the contact structures in the second direction and in the third direction.

10. The method of claim 7, wherein after the opening is formed, the method further comprises:

remaining second semiconductor material layers are removed by means of etching; and forming insulation layers at positions where the second semiconductor material layers are removed by means of etching, wherein the insulation layers comprise first insulation layers located in the first area and second insulation layers located in the second area.

11. The method of claim 10, wherein the forming a storage node in each of the capacitor hole comprises:

forming the first electrode on an inner wall of the capacitor hole;

forming the dielectric layer on an inner wall of the first electrode and an end face of the first electrode that is far from the contact structure in the first direction; and forming the second electrode on an inner wall of the dielectric layer, wherein the second electrode is filled in the capacitor hole.

12. The method of claim 11, wherein before the storage node is formed, the method further comprises:

thinning the second insulation layers to cause a width of thinned second insulation layers in the third direction to range from 5 nm to 10 nm.

13. The method of claim 10, wherein the forming a storage node in each of the capacitor holes comprises:

forming the first electrode on an inner wall of the capacitor hole, wherein the first electrode has a cup shape with an opening in the first direction;

forming the dielectric layer on an inner wall and an outer wall of the first electrode; and forming the second electrode on an inner wall and an outer wall of the dielectric layer.

14. The method of claim 13, further comprising:

after the first electrode is formed, removing the second insulation layers and vertical insulation layers in the second area by means of etching; and after the second electrode is formed, forming a conductive layer on an inner wall of the second electrode and a gap between any adjacent storage nodes, wherein the conductive layer is filled in the capacitor holes.

* * * * *